United States Patent
Saboundji et al.

(10) Patent No.: US 12,110,581 B2
(45) Date of Patent: Oct. 8, 2024

(54) AIRCRAFT PART MADE OF SUPERALLOY COMPRISING RHENIUM AND/OR RUTHENIUM AND ASSOCIATED MANUFACTURING METHOD

(71) Applicant: SAFRAN, Paris (FR)

(72) Inventors: Amar Saboundji, Moissy-Cramayel (FR); Fabrice Crabos, Moissy-Cramayel (FR)

(73) Assignee: SAFRAN, Paris (FR)

(*) Notice: Subject to any disclaimer, the term of this patent is extended or adjusted under 35 U.S.C. 154(b) by 0 days.

(21) Appl. No.: 17/766,764

(22) PCT Filed: Oct. 8, 2020

(86) PCT No.: PCT/FR2020/051775
§ 371 (c)(1),
(2) Date: Apr. 6, 2022

(87) PCT Pub. No.: WO2021/069842
PCT Pub. Date: Apr. 15, 2021

(65) Prior Publication Data
US 2024/0093343 A1   Mar. 21, 2024

(30) Foreign Application Priority Data
Oct. 8, 2019 (FR) .................... 1911122

(51) Int. Cl.
*C23C 14/02* (2006.01)
*B32B 15/01* (2006.01)
(Continued)

(52) U.S. Cl.
CPC ............ *C23C 14/021* (2013.01); *B32B 15/01* (2013.01); *C22C 19/058* (2013.01); *C23C 14/16* (2013.01);
(Continued)

(58) Field of Classification Search
None
See application file for complete search history.

(56) References Cited

U.S. PATENT DOCUMENTS

| 7,250,225 B2 * | 7/2007 | Hazel ............... C23C 30/00 |
| | | 428/650 |
| 2002/0004143 A1 * | 1/2002 | Hasz ............... C23C 28/3215 |
| | | 427/455 |

(Continued)

FOREIGN PATENT DOCUMENTS

| CN | 109554582 A | 4/2019 |
| EP | 0 821 076 A1 | 1/1998 |

(Continued)

OTHER PUBLICATIONS

Li Wang et al., "Effect of Surface Roughness on the Oxidation Behavior of a Directionally Solidified Ni-Based Superalloy at 1,100 C", 2015, Acta Metall. Sin., vol. 28, p. 381-385. (Year: 2015).*

(Continued)

*Primary Examiner* — Kim S. Horger
(74) *Attorney, Agent, or Firm* — Sughrue Mion, PLLC (57) ABSTRACT

The present invention relates to a method for manufacturing a part, comprising the steps of chemically etching, in a wet acid medium, at least a portion of a surface of a substrate made of a monocrystalline superalloy, comprising at least one element chosen from rhenium and ruthenium, the substrate having a γ-γ' phase, the substrate having an average mass fraction of rhenium and/or ruthenium greater than or equal to 3%, the chemical etching being done in such a way that the average mass fraction of rhenium and/or ruthenium over the portion of the surface of the substance is less than 2%, and a step of depositing on the portion of the substrate a protective coating having a γ-γ' phase and an average mass fraction of rhenium and/or ruthenium of less than 1%.

18 Claims, 4 Drawing Sheets

(51) Int. Cl.
*C22C 19/05* (2006.01)
*C23C 14/16* (2006.01)

(52) U.S. Cl.
CPC ....... *B32B 2311/22* (2013.01); *B32B 2605/18* (2013.01)

(56) References Cited

U.S. PATENT DOCUMENTS

| | | | |
|---|---|---|---|
| 2003/0022012 A1* | 1/2003 | Warnes | C23C 28/321 |
| | | | 428/629 |
| 2005/0136283 A1* | 6/2005 | Pfaendtner | C23C 28/321 |
| | | | 428/650 |
| 2010/0159136 A1 | 6/2010 | Lee et al. | |
| 2012/0128525 A1* | 5/2012 | Kulkarni | C22C 19/055 |
| | | | 420/443 |
| 2012/0189488 A1* | 7/2012 | Hasselqvist | C22C 19/055 |
| | | | 420/443 |
| 2016/0168661 A1* | 6/2016 | Yoshizawa | F01D 5/288 |
| | | | 428/621 |
| 2017/0306451 A1* | 10/2017 | Dheeradhada | C23C 30/00 |

FOREIGN PATENT DOCUMENTS

| | | | |
|---|---|---|---|
| EP | 1 184 656 A1 | 3/2002 | |
| EP | 2 377 683 A2 | 10/2011 | |
| EP | 2700733 A1 * | 2/2014 | ............ B32B 15/01 |
| WO | 2015/181549 A1 | 12/2015 | |

OTHER PUBLICATIONS

D. Naumenko, et al., "Overview on Recent Developments of Bondcoats for Plasma-Sprayed Thermal Barrier Coatings", Journal of Thermal Spray Technology, ASM International, Materials Park, US, Oct. 30, 2017, pp. 1743-1757, vol. 26, No. 8.

Hongrui Yao, et al., "Low inter-diffusivity γ'-base bondcoats for single crystal superalloy René N5.I: Primary study of microstructures and oxidation behaviors at 1100 ", Corrosion Science, Nov. 26, 2018, pp. 299-312, vol. 147.

International Search Report for PCT/FR2020/051775 dated Nov. 27, 2020.

Written Opinion for PCT/FR2020/051775 dated Nov. 27, 2020.

\* cited by examiner

AIRCRAFT PART MADE OF SUPERALLOY COMPRISING RHENIUM AND/OR RUTHENIUM AND ASSOCIATED MANUFACTURING METHOD

CROSS REFERENCE TO RELATED APPLICATIONS

This application is a National Stage of International Application No. PCT/FR2020/051775 filed Oct. 8, 2020, claiming priority based on French Patent Application No. 1911122 filed Oct. 8, 2019, the entire contents of each of which being herein incorporated by reference in their entireties.

FIELD OF THE INVENTION

The invention relates to an aircraft part, such as a turbine blade or a distributor vane, for example.

PRIOR ART

In a turbojet engine, the exhaust gases generated by the combustion chamber can reach high temperatures, for example greater than 1200° C., or even 1600° C. The parts of the turbojet engine in contact with these exhaust gases, such as the turbine blades for example, must therefore be capable of retaining their mechanical properties at these high temperatures.

For this purpose, it is known to manufacture certain parts of the turbojet engine from "superalloy". Superalloys are a family of highly resistant metal alloys which can work at temperatures relatively close to their melting points (typically 0.7 to 0.8 times their melting temperatures).

It is known to introduce rhenium and/or ruthenium into a superalloy in order to increase its mechanical resistance capabilities, in particular its resistance to creep, at high temperatures. In particular, the introduction of rhenium and/or ruthenium increases the temperature of use of these superalloys by approximately 100° C. relative to superalloys that are devoid of rhenium and/or ruthenium.

However, the increase in the average mass fraction of rhenium and/or ruthenium of the superalloy requires a reduction in the average mass fraction of chromium in the superalloy, so as to maintain a stable allotropic structure of the superalloy, in particular a stable γ-γ' phase. However, the chromium in the superalloy promotes the formation of the oxide $Cr_2O_3$, having the same crystallographic structure as $α-Al_2O_3$ and thus enabling the nucleation of a layer of $α-Al_2O_3$. This stable layer of $α-Al_2O_3$ contributes to protecting the superalloy against oxidation. The increase in the average mass fraction of rhenium and/or ruthenium consequently leads to a reduced resistance to oxidation of the superalloy compared with a superalloy that is devoid of rhenium and/or ruthenium.

In order to reinforce the thermal resistance of these superalloys and to protect them against oxidation and corrosion, it is also known to cover them with a thermal barrier.

Figure 1:
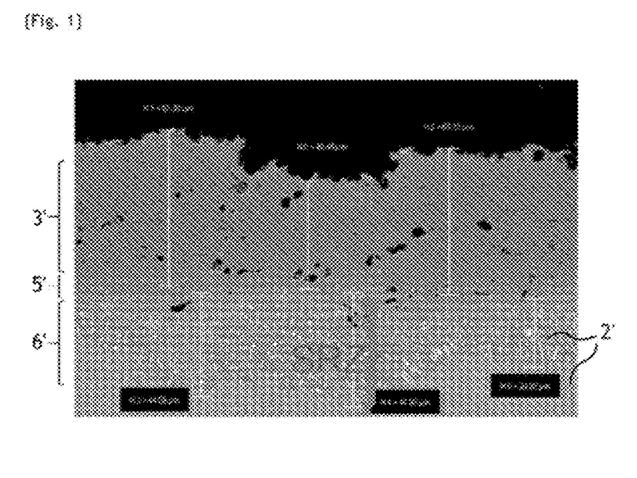
FIG. 1, already discussed, is a scanning electron microscope photograph of the microstructure of a substrate and of a bonding layer of the prior art, after the part has been subjected to thermal working representative of use of the part.
Figure 2:
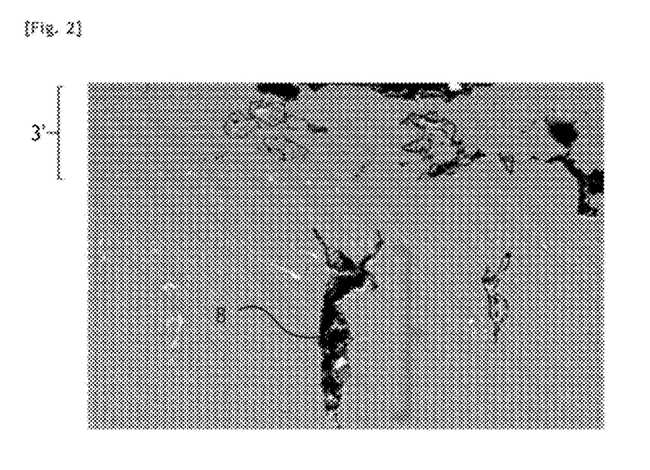
FIG. 2, already discussed, is a scanning electron microscope photograph of the microstructure of a detail of a substrate and of a bonding layer of the prior art, after the part has been subjected to a thermal mechanical stress representative of use of the part, the substrate comprising a crack.

With reference to FIGS. 1 and 2, an aircraft part 1 of the prior art can, for example, comprise a substrate 2' made of monocrystalline metallic superalloy covered with a coating, for example an environmental barrier comprising a thermal barrier.

The environmental barrier typically a comprises protective coating 3' between the substrate 2' and thermal barrier. The protective coating 3' is preferably a metallic bonding layer 3'. The bonding layer 3' covers the substrate 2' made of metallic superalloy. The bonding layer 3' is itself typically covered by a protective layer, formed by oxidation of the metallic bonding layer 3'. The protective layer protects the substrate 2' made of superalloy from corrosion and/or oxidation. The thermal barrier covers the protective layer. The thermal barrier can be made of ceramic, for example yttriated zirconia.

The average mass fraction of aluminium of the sublayer 3' is sufficient for exclusively forming a protective layer of aluminium oxide ($Al_2O_3$) protecting the substrate made of superalloy 2' against oxidation and corrosion.

However, when the part is subjected to high temperatures, the difference in the average mass fraction of nickel, and especially of aluminium, between the substrate made of superalloy 2' and the metal bonding layer 3' causes a diffusion of the various elements, in particular of the nickel contained in the substrate, towards the metallic bonding layer, and of the aluminium contained in the metallic bonding layer towards the superalloy. This phenomenon is called "interdiffusion".

Interdiffusion can cause the formation of primary and secondary reactions zones (SRZ) in a portion of the substrate 2' in contact with the bonding layer 3'. These zones are commonly called "interdiffusion zones".

FIG. 1 is a micrograph of the section of a bonding layer 3' covering a substrate 2' of a part 1' from the prior art. The micrograph is produced after the part has been subjected to a series of thermal cycles simulating the temperature conditions of the part 1' during use. The substrate 2' is rich in rhenium, in other words the average mass fraction of rhenium is greater than or equal to 3% and preferably greater than or equal to 4%. It is known to use rhenium in the composition of superalloys in order to increase the resistance to creep of the superalloy parts. Typically, the substrate 2' has a γ-γ' phase and in particular a γ-Ni phase. The substrate 2' has a primary interdiffusion zone 5', in the portion of the substrate directly covered by the bonding layer 3'. The substrate 2' also has a secondary interdiffusion zone 6', directly covered by the primary interdiffusion zone 5'.

With reference to FIG. 2, the interdiffusion phenomena cause a premature depletion of the bonding layer 3' in aluminium, which promotes phase changes in the bonding layer 3' (for example martensitic transformations). These transformations modify the allotropic structure of the bonding layer 3' and/or of the interdiffusion zones, generating cracks 8 there following creep-type thermomechanical stresses, promoting the premature degradation by creep of the system comprising the superalloy and the coating.

Hence, the interdiffusion between the substrate 2' made of superalloy and the bonding layer 3' can have detrimental consequences for the service life of the superalloy part.

DISCLOSURE OF THE INVENTION

An object of the invention is to propose a solution for efficiently protecting a turbine part made of superalloy from oxidation and corrosion while increasing its service life, during use, compared with known parts.

Another object of the invention is to limit or prevent the formation of secondary reaction zones while allowing an aluminium oxide to be formed during use of the part.

Finally, another object of the invention is to at least partially prevent the formation of cracks in the substrate of a part subjected to high-temperature conditions, for example greater than 1000° ° C. as well as the flaking of the protective layer of aluminium oxide.

These objects are achieved in the context of the present invention through a method for manufacturing a part, comprising the steps of:

a) chemical attack, in a wet acid medium, of at least a portion of a surface of a substrate made of a monocrystalline superalloy, comprising at least one element chosen from rhenium and ruthenium, the substrate having a γ-γ' phase, the substrate having an average mass fraction of rhenium and/or ruthenium greater than or equal to 3%, preferably greater than or equal to 4%, the chemical attack being carried out in such a way that the average mass fraction of rhenium and/or ruthenium over the portion of the surface of the substrate is less than 2%, b) depositing on the portion of the substrate a protective coating having a γ-γ' phase and an average mass fraction of rhenium and/or ruthenium of less than 1%.

The invention is advantageously supplemented by the following features, taken individually or in any of the possible technical combinations thereof:

the substrate is made of nickel-based monocrystalline superalloy, the substrate comprises chromium, the average mass fraction of chromium being less than 5% and preferably less than 3%, the chemical attack is a chemical etching, the chemical attack is carried out so that the portion of the surface of the substrate has an arithmetic average roughness $R_a$ between 0.5 μm and 5 μm and preferably a maximum roughness $R_Z$ between 5.5 μm and 50 μm, the roughnesses $R_a$ and $R_Z$ being measured over areas greater than 1 mm².

the chemical attack in acid medium is carried out by a bath in contact with the portion of the surface of the substrate, the bath comprising at least one element from hydrofluoric acid, nitric acid with ferric chloride and with hydrochloric acid, hydrochloric acid with ferric chloride, hydrochloric acid with hydrogen peroxide, and nitric acid with hydrochloric acid, the chemical attack in acid medium is carried out by a bath in contact with the portion of the surface of the substrate, an electrical potential of the bath being controlled so as to cause an electrochemical reaction on the portion of the surface, the bath preferably comprising at least one element from nitric acid and acetic acid, sulfuric acid, and phosphoric acid.

Another aspect of the invention is a part comprising:

a substrate made of a monocrystalline superalloy, comprising at least one element chosen from rhenium and ruthenium, the substrate having a γ-γ' phase, an average mass fraction of rhenium and/or ruthenium greater than or equal to 3%, preferably greater than or equal to 4%, a protective coating covering at least a portion of a surface of the substrate, the average mass fraction of rhenium and/or ruthenium on the portion of the surface of the substrate being less than 2%, and the protective coating having a γ-γ' phase and an average mass fraction of rhenium and/or ruthenium of less than 1%.

The invention is advantageously supplemented by the following features, taken individually or in any of the possible technical combinations thereof:

the substrate comprises chromium, the average mass fraction of chromium being less than 58 and preferably less than 3%, the portion of the surface of the substrate has an arithmetic average roughness $R_a$ between 0.5 μm and 5 μm and preferably a maximum roughness $R_Z$ between 5.5 μm and 50 μm, the roughnesses $R_a$ and $R_Z$ being measured over areas greater than 1 mm² and being obtained by chemical attack in a wet acid medium of the portion of the surface of the substrate, the protective coating being predominantly, by volume, a γ' phase, the protective coating comprises at least nickel, aluminium, chromium, hafnium and silicon, the protective coating has:

a majority average mass fraction of nickel, an average mass fraction of aluminium between 5% and 15%, an average mass fraction of chromium between 7% and 15%, an average mass fraction of hafnium between 0.5% and 2%, and an average mass fraction of silicon between 0.5% and 3%.

Another aspect of the invention is an aircraft part according to the invention.

Another aspect of the invention is an aircraft turbine comprising a part according to the invention.

Another aspect of the invention is an aircraft comprising a part according to the invention.

DESCRIPTION OF THE FIGURES

Other features, aims and advantages of the invention will emerge from the following description, which is given purely by way of illustration and not being limiting and which should be read with reference to the attached drawings, in which.

Over the set of figures, similar elements have identical reference signs.

DEFINITIONS

The term "superalloy" designates an alloy having, at high temperature and high pressure, a very good resistance to oxidation, to corrosion, to creep and to cyclic stresses (in particular mechanical or thermal cyclic stresses). The superalloys have a particular application in the manufacture of parts used in aeronautics, for example turbine blades, because they constitute a family of highly resistant alloys that can work at temperatures relatively close to their melting point (typically 0.7 to 0.8 times their melting temperatures).

A superalloy can have a biphasic microstructure comprising a first phase (called "γ phase") forming a matrix and a second phase (called "γ' phase") forming hardening precipitates in the matrix. The coexistence of these two phases is designated by "γ-γ' phase"

The "base" of the superalloy designates the main metal component of the matrix. In the majority of cases, the superalloys comprise an iron, cobalt or nickel base, but also sometimes comprise a titanium or aluminium base. The base of the superalloy is preferably a nickel base.

"Nickel-based superalloys" have the advantage of offering a good compromise between resistance to oxidation, resistance to failure at high temperature and weight, which justifies their use in the hottest portions of turbojet engines.

The nickel-based superalloys consist of a γ phase (or matrix) of cubic austenitic type with face-centred γ-Ni, optionally containing solid solution additives of α substitution (Co, Cr, W, Mo), and a γ' phase (or precipitates) of type γ'-Ni$_3$X, with X=Al, Ti or Ta. The γ' phase has an ordered L12 structure, derived from the face-centred cubic structure, coherent with the matrix, in other words having an atomic spacing very close to it.

In terms of its ordered nature, the γ' phase has the remarkable property of having a mechanical strength which increases with temperature up to approximately 800° C. The very strong coherence between the γ and γ' phases confers a very high hot mechanical strength on the nickel-based superalloys, which itself depends on the ratio γ/γ' and the size of the hardening precipitates.

A superalloy is, in all the embodiments of the invention, rich in rhenium and/or in ruthenium, in other words the average mass fraction in rhenium and in ruthenium of the superalloy is greater than or equal to 3%, and preferably greater than or equal to 4%, increasing the resistance to creep of the superalloy parts compared with parts made of superalloy without rhenium.

A superalloy preferably has a low average chromium content, in other words the average mass fraction of chromium in all of the superalloy is less than 5%, preferably less than 3%. Indeed, the depletion in chromium during an enrichment in rhenium and/or ruthenium of the superalloy maintains a stable allotropic structure of the superalloy, in particular a γ-γ' phase.

The "mass fraction" terms designate the ratio, by mass, of an element or a group of elements over the total mass.

Aspects of the roughness of a surface can preferably be defined by the arithmetic mean roughness, called R$_a$, measured over an area greater than 1 mm², and/or by the maximum roughness, called R$_z$, measured over an area greater than 1 mm². The roughness measurement or measurements can be carried out by an optical or mechanical profilometer.

"Chemical attack in a wet acid medium" of a surface of a substrate shall mean placing the surface of the substrate in contact with a liquid phase comprising an acid, for example in the form of a bath. The liquid phase can be aqueous, having a predetermined acid concentration. Alternatively, the liquid phase can comprise a pure acid in liquid form. A chemical attack can, in particular, be an electrochemical attack.

"Protective coating" shall mean a layer covering the substrate and chemically and/or mechanically protecting it.

The protective coating preferably prevents corrosion and/or oxidation of the substrate. The protective coating is preferably a bonding layer between the substrate and a thermal protection layer.

DETAILED DESCRIPTION OF THE INVENTION

Figure 3:
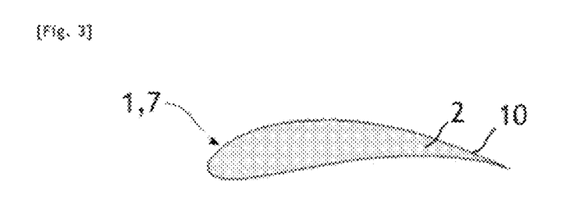
FIG. 3 schematically illustrates a section of an aircraft part, for example a turbine blade or a distributor vane.

With reference to FIG. 3, a part 1, preferably an aircraft part 1, comprises a substrate 2 made of monocrystalline superalloy. The monocrystalline superalloy is preferably a nickel-based superalloy, but can also be a cobalt-based superalloy, obtained for example by an equiaxial casting method or by directional solidification. The substrate 2 comprises chromium and at least one element chosen from rhenium and ruthenium. The substrate 2 has a γ-γ' phase and an average mass fraction of rhenium and/or ruthenium greater than or equal to 3% and preferably greater than or equal to 4%. The substrate 2 preferably has an average mass fraction of chromium less than or equal to 5% and preferably less or equal to 38. The substrate 2 can, for example, be manufactured in CMSX4 plus (registered trademark), having the chemical composition, in average mass fraction percentage, described in table 1.

TABLE 1

| Cr | Co | Mo | Ta | W | Cb | Re | Al | Ti | Hf | Ni |
|---|---|---|---|---|---|---|---|---|---|---|
| 3.5 | 1.0 | 0.6 | 8 | 6 | 0 | 4.8 | 5.7 | 0.85 | 0.1 | Rest |

The part 1 also comprises a protective coating 3. The protective coating 3 covers at least a portion of a surface of the substrate 2. The protective coating 3 being predominantly, by volume, a γ-γ' phase. Hence, the allotropic structure of the protective coating 3 is similar to that of the substrate 2, which prevents or reduces the formation of a secondary reaction layer in the substrate 2 during use of the part 1.

The protective coating 3 can be formed by physical or chemical deposition. It can preferably be formed under vacuum by physical vapour deposition (PVD). Various methods of PVD can be used for the manufacture of the enrichment layer 11, such as cathodic spraying, electron gun evaporation, laser ablation and electron-beam physical vapour deposition. The protective coating 3 can, alternatively, be formed by thermal spraying, and more particularly by high velocity oxygen fuel spraying (HVOF).

The protective coating 3 has an average mass fraction of rhenium and/or of ruthenium less than 1% and preferably contains no rhenium or ruthenium. Thus, it is possible to avoid the formation of a secondary reaction zone in the substrate 2. The protective coating 3 is preferably manufactured from material of type MCrAlY, where M represents at least one element chosen from Ni, Co and Fe.

Alternatively, the protective coating 3 is manufactured from material of type NiAlCrHfSi, in other words the protective coating 3 comprises at least nickel, aluminium, chromium, hafnium and silicon. In particular, the protective coating 3 has a majority average mass fraction of nickel, and average mass fraction of aluminium of between 5% and 15%, an average mass fraction of chromium of between 7% and 15%, an average mass fraction of Hafnium 0.5% and 2%, and an average mass fraction of silicon between 0.5% and 3%. Hence, the allotropic structure of the protective coating 3 is stable and can remain of type γ-γ' during use of the part 1. Martensitic-type transformations can thus be avoided. In particular, the protective coating 3 can have a nickel base, an average mass fraction of aluminium of approximately 6%, an average mass fraction of chromium of approximately 12%, an average mass fraction of hafnium of approximately 1.78 and an average mass fraction of silicon of approximately 0.3%.

The inventors have discovered that the stability of the protective coating 3 during use of the part 1 can be increased by reducing the differential in average mass fraction of rhenium and/or of ruthenium between the substrate 2 and the protective coating 3. Hence, the substrate 2 has an average mass fraction, at the surface, of rhenium and/or of ruthenium, more particularly on the portion of the surface of the substrate 2 intended to be in contact with the protective coating 3, less than 2% and preferably less than 1%.

In known manner, the surface condition of the substrate 2 can be controlled by sandblasting before the formation of the protective coating 3 on the substrate 2. The inventors have discovered that the roughness caused by the sandblasting was too high to ensure an acceptable adhesion between the substrate 2 and the protective coating 3 during use of the part 1. The portion of the surface of the substrate 2 has an arithmetic average roughness $R_a$ between 0.5 μm and 5 μm and preferably a maximum roughness $R_Z$ between 5.5 μm and 50 μm, the roughnesses $R_a$ and $R_Z$ being measured over areas greater than 1 mm². The roughnesses $R_a$ and $R_Z$ are obtained by chemical attack in a wet acid medium of the portion of surface of the substrate 2. The chemical attack can be carried out in addition to the sandblasting of the portion of the surface of the substrate. These roughness ranges reduce the mechanical stresses at the surface of the substrate 2 when the protective coating 3 is deposited, and thus improved the adhesion between the substrate 2 and the protective coating 3.

Figure 4:
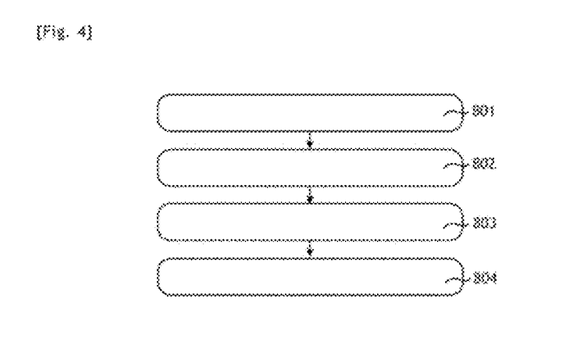
FIG. 4 schematically illustrates a method for manufacturing a part according to an embodiment of the invention.
Figure 5:
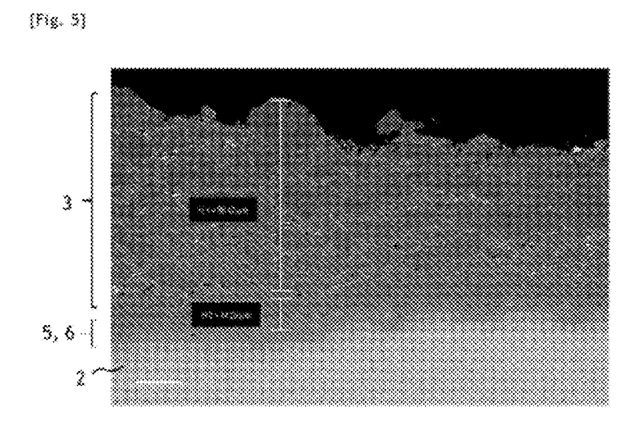
FIG. 5 is a scanning electron microscope photograph of the microstructure of a substrate and of a bonding layer according to an embodiment of the invention.
Figure 6:
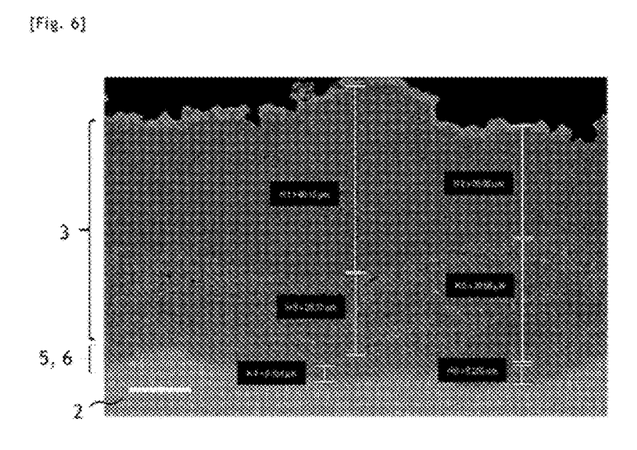
FIG. 6 is a scanning electron microscope photograph of the microstructure of a substrate and of a bonding layer according to an embodiment of the invention.
Figure 7:
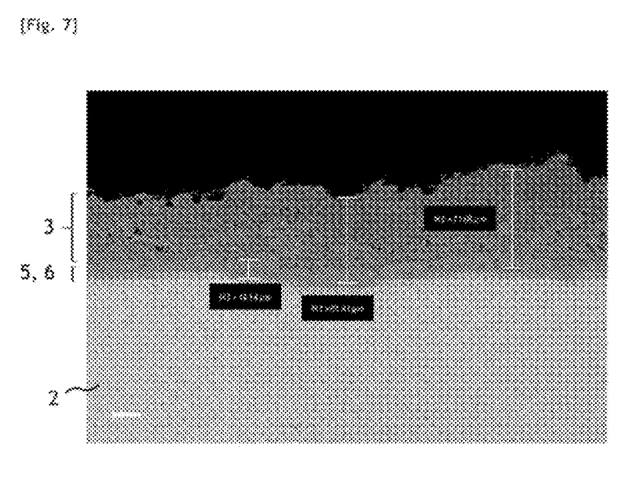
FIG. 7 is a scanning electron microscope photograph of the microstructure of a substrate and of a bonding layer according to an embodiment of the invention.

With reference to FIG. 4, a method for manufacturing a part 1 can comprise a step 801 of providing a substrate 2 made of a monocrystalline superalloy that is preferably nickel-based, comprising chromium and at least one element chosen from rhenium and ruthenium, the substrate 2 having an average mass fraction of rhenium and/or of ruthenium greater than or equal to 3, and preferably greater than or equal to 4%, and an average mass fraction of chromium less than or equal to 5% and preferably less than or equal to 3%.

The method may comprise a step 802 of mechanically controlling the surface condition of the substrate 2, preferably a step of sandblasting the surface.

The method comprises a step 803 of chemical attack in a wet acid medium of at least a portion of the surface of a substrate 2, and preferably a step of chemical etching in a wet acid medium. The inventors have discovered that chemical attack in a wet acid medium of the surface of the substrate reduces the average mass fraction of rhenium and/or of ruthenium at the surface of the substrate 2, and/or also enables control of the roughness of the surface of the substrate 2 in the above cited ranges of roughness $R_a$ and $R_Z$. The average mass fraction of rhenium and/or ruthenium can preferably be, on average, less than 2% in a layer of the portion of the substrate 2 running from the surface of the substrate 2 to a depth of 10 μm from the surface of the substrate 2.

The chemical attack in wet medium can be carried out by soaking the portion of the surface of the substrate 2 in at least one element from hydrofluoric acid, nitric acid with ferric chloride and hydrochloric acid, hydrochloric acid with ferric chloride, hydrochloric acid with hydrogen peroxide, and nitric acid with hydrochloric acid, Alternatively, or in combination, the chemical attack in acid medium can be carried out by controlling the potential of a bath in contact with the portion of the surface of the substrate 2 so as to cause an electrochemical reaction. The bath preferably comprises at least one element from nitric acid and acetic acid, sulfuric acid, and phosphoric acid.

CHEMICAL ATTACK EXAMPLES

Example 1

The chemical attack of the substrate 2 may comprise bathing the substrate 2 in a mixture of hydrochloric acid and ferric chloride. The volume of hydrochloric acid can be between 7% and 15% of the volume of ferric chloride. The bath is stirred by compressed air. The bath is maintained at a temperature of 65° C. for a time between 250 s and 3000 s. The bath is then rinsed from the surface of the substrate 2 by cold water for 5 minutes. The surface of the substrate 2 is then neutralised by a sodium hydroxide solution having a concentration by weight of 300 g/L for 5 minutes, at a temperature of 75° C. The neutralising solution is stirred by compressed air. The neutralising solution is then rinsed from the surface of the substrate 2 by cold water for 5 minutes. The surface of the substrate 2 is rinsed once more by cold water for 5 minutes in an ultrasound bath. The surface of the substrate 2 is dried after rinsing the surface with water at 80° C. for 5 minutes.

Example 2

The substrate 2 is rinsed with water for 1 to 2 minutes at room temperature. The chemical attack comprises bathing the substrate 2 in a solution composed of $H_3PO_4$ (70% by volume) and water (30% by volume). The bath is maintained at a temperature between 30 and 70° C. for a time between 180 s and 3000 s. An electric current between 2 and 10 A is applied on the substrate, corresponding to a surface current between 0.2 and 2 A·cm². The bath is then rinsed from the surface of the substrate 2 by cold water for 5 minutes. The surface of the substrate 2 is then neutralised by a sodium hydroxide solution having a concentration by weight of 300 g/L, for 5 minutes, at a temperature between 50° C. and 80° C. The neutralising solution is stirred by compressed air. The neutralising solution is then rinsed from the surface of the substrate 2 by cold water for 5 minutes. The surface of the substrate 2 is rinsed once more by cold water for 5 minutes in an ultrasound bath. The surface of the substrate 2 is dried after rinsing the surface with water at 80° ° C. for 5 minutes.

The method comprises, after the chemical attach step 803, a step 804 of depositing the protective coating 3, preferably according to one of the above-mentioned methods.

The invention claimed is:

1. A method for manufacturing a part, comprising the steps of:
   a) chemical attack, in a wet acid medium, of at least a portion of a surface of a substrate made of a monocrystalline superalloy, comprising at least one element chosen from rhenium and ruthenium, the substrate having a γ-γ' phase, the substrate having an average mass fraction of rhenium and/or ruthenium greater than or equal to 3%, the chemical attack being carried out in such a way that the average mass fraction of rhenium and/or ruthenium over the portion of the surface of the substrate is less than 2%, and such that the at least a portion of the surface of the substrate has an arithmetic average roughness $R_a$ between 0.5 μm and 5 μm, the arithmetic average roughness $R_a$ being measured over an area greater than 1 mm$^2$, b) depositing on the at least a portion of the substrate a protective coating having a γ-γ' phase and an average mass fraction of rhenium and/or ruthenium of less than 1%.

2. The method according to claim 1, wherein the substrate is made of nickel-based monocrystalline superalloy.

3. The method according to claim 1, wherein the substrate comprises chromium, the average mass fraction of chromium being less than 5%.

4. The method according to one of claim 1, wherein the chemical attack is a chemical etching.

5. The method according to claim 1, wherein the chemical attack in acid medium is carried out by a bath in contact with the at least a portion of the surface of the substrate, the bath comprising at least one element from hydrofluoric acid, nitric acid with ferric chloride and with hydrochloric acid, hydrochloric acid with ferric chloride, hydrochloric acid with hydrogen peroxide, and nitric acid with hydrochloric acid.

6. The method according to claim 1, wherein the chemical attack in acid medium is carried out by a bath in contact with the at least a portion of the surface of the substrate, an electrical potential of the bath being controlled so as to cause an electrochemical reaction on the at least a portion of the surface, the bath comprising at least one element from nitric acid and acetic acid, sulfuric acid, and phosphoric acid.

7. A part, comprising:
a substrate made of a monocrystalline superalloy, comprising at least one element chosen from rhenium and ruthenium, the substrate having a γ-γ' phase, an average mass fraction of rhenium and/or ruthenium greater than or equal to 3%,
a protective coating covering at least a portion of a surface of the substrate,
wherein
the average mass fraction of rhenium and/or ruthenium on the portion of the surface of the substrate is less than 2%, and
the protective coating has a γ-γ' phase and an average mass fraction of rhenium and/or ruthenium of less than 1%, and wherein the at least a portion of the surface of the substrate has an arithmetic average roughness $R_a$ between 0.5 μm and 5 μm, the arithmetic average roughness $R_a$ being measured over an area greater than 1 mm$^2$ and being obtained by chemical attack in a wet acid medium of the at least a portion of the surface of the substrate.

8. The part according to claim 7, wherein the substrate comprises chromium, an average mass fraction of chromium being less than 5%.

9. The part according to claim 7, wherein the protective coating has predominantly by volume a γ' phase.

10. The part according to claim 7, wherein the protective coating comprises at least nickel, aluminium, chromium, hafnium and silicon.

11. The part according to claim 10, wherein the protective coating has:
a majority average mass fraction of nickel,
an average mass fraction of aluminium between 5% and 15%,
an average mass fraction of chromium between 7% and 15%,
an average mass fraction of hafnium between 0.5% and 2%,
and
an average mass fraction of silicon between 0.5% and 3%.

12. The part according to claim 7, wherein the part is an aircraft part.

13. An aircraft turbine comprising the part according to claim 7.

14. An aircraft comprising the part according to claim 7.

15. The method according to claim 1, wherein the substrate has an average mass fraction of rhenium and/or ruthenium greater than or equal to 4%.

16. The method according to claim 1, wherein the chemical attack is carried out so that the at least a portion of the surface of the substrate has a maximum roughness $R_Z$ between 5.5 μm and 50 μm, the maximum roughness $R_Z$ being measured over an area greater than 1 mm$^2$.

17. The part according to claim 7, wherein the substrate has the average mass fraction of rhenium and/or ruthenium greater than or equal to 4%.

18. The part according to claim 7, wherein the at least a portion of the surface of the substrate has a maximum roughness $R_Z$ between 5.5 μm and 50 μm, the maximum roughness $R_Z$ being measured over an area greater than 1 mm$^2$ and being obtained by chemical attack in a wet acid medium of the at least a portion of the surface of the substrate.

* * * * *